(12) United States Patent
Preti et al.

(10) Patent No.: US 11,377,754 B2
(45) Date of Patent: Jul. 5, 2022

(54) EPITAXIAL DEPOSITION REACTOR WITH REFLECTOR EXTERNAL TO THE REACTION CHAMBER AND COOLING METHOD OF A SUSCEPTOR AND SUBSTRATES

(71) Applicant: LPE S.p.A., Baranzate (IT)

(72) Inventors: Silvio Preti, Baranzate (IT); Vincenzo Ogliari, Baranzate (IT); Franco Preti, Baranzate (IT)

(73) Assignee: LPE S.P.A., Baranzate (IT)

( * ) Notice: Subject to any disclaimer, the term of this patent is extended or adjusted under 35 U.S.C. 154(b) by 173 days.

(21) Appl. No.: 16/337,988

(22) PCT Filed: Sep. 27, 2017

(86) PCT No.: PCT/IB2017/055888
§ 371 (c)(1),
(2) Date: Mar. 29, 2019

(87) PCT Pub. No.: WO2018/065852
PCT Pub. Date: Apr. 12, 2018

(65) Prior Publication Data
US 2020/0024768 A1    Jan. 23, 2020

(30) Foreign Application Priority Data

Oct. 5, 2016  (IT) .................. 102016000099783

(51) Int. Cl.
*C30B 25/12* (2006.01)
*C30B 25/08* (2006.01)
(Continued)

(52) U.S. Cl.
CPC .......... *C30B 25/12* (2013.01); *C23C 16/4411* (2013.01); *C23C 16/4584* (2013.01);
(Continued)

(58) Field of Classification Search
None
See application file for complete search history.

(56) References Cited

U.S. PATENT DOCUMENTS

| 6,022,412 A | 2/2000 | Vincenzo et al. |
| 8,426,778 B1 * | 4/2013 | Bolt ....................... B05D 3/067 219/405 |

(Continued)

FOREIGN PATENT DOCUMENTS

| CN | 1139460 A | 1/1997 |
| CN | 2865211 Y | 1/2007 |

(Continued)

*Primary Examiner* — Karla A Moore
*Assistant Examiner* — Tiffany Z Nuckols
(74) *Attorney, Agent, or Firm* — Dickinson Wright PLLC; Andrew D. Dorisio

(57) ABSTRACT

The present invention relates to a reactor (1) for epitaxial deposition of semiconductor material on substrates (100), comprising: a reaction chamber (2) provided with a cavity (20) defined by a lower wall (21), an upper wall (22) and lateral walls (23, 24); a susceptor (3), positioned inside said cavity (20), and adapted to support and heat substrates (100) during epitaxial deposition; a heating system (6) adapted to heat said susceptor (3); an upper plate (7) that is positioned above said upper wall (22) and that overlies said susceptor (3) so that it reflects thermal radiation emitted by said susceptor (3) towards said susceptor (3). A liquid flow (LF) is provided in or on said upper plate (7) to cool said upper plate (7). A gaseous flow (GF) is provided between said upper wall (22) and said upper plate (7) to promote the transfer of heat from said upper wall (22) to said upper plate (7).

11 Claims, 5 Drawing Sheets

Figure 1:
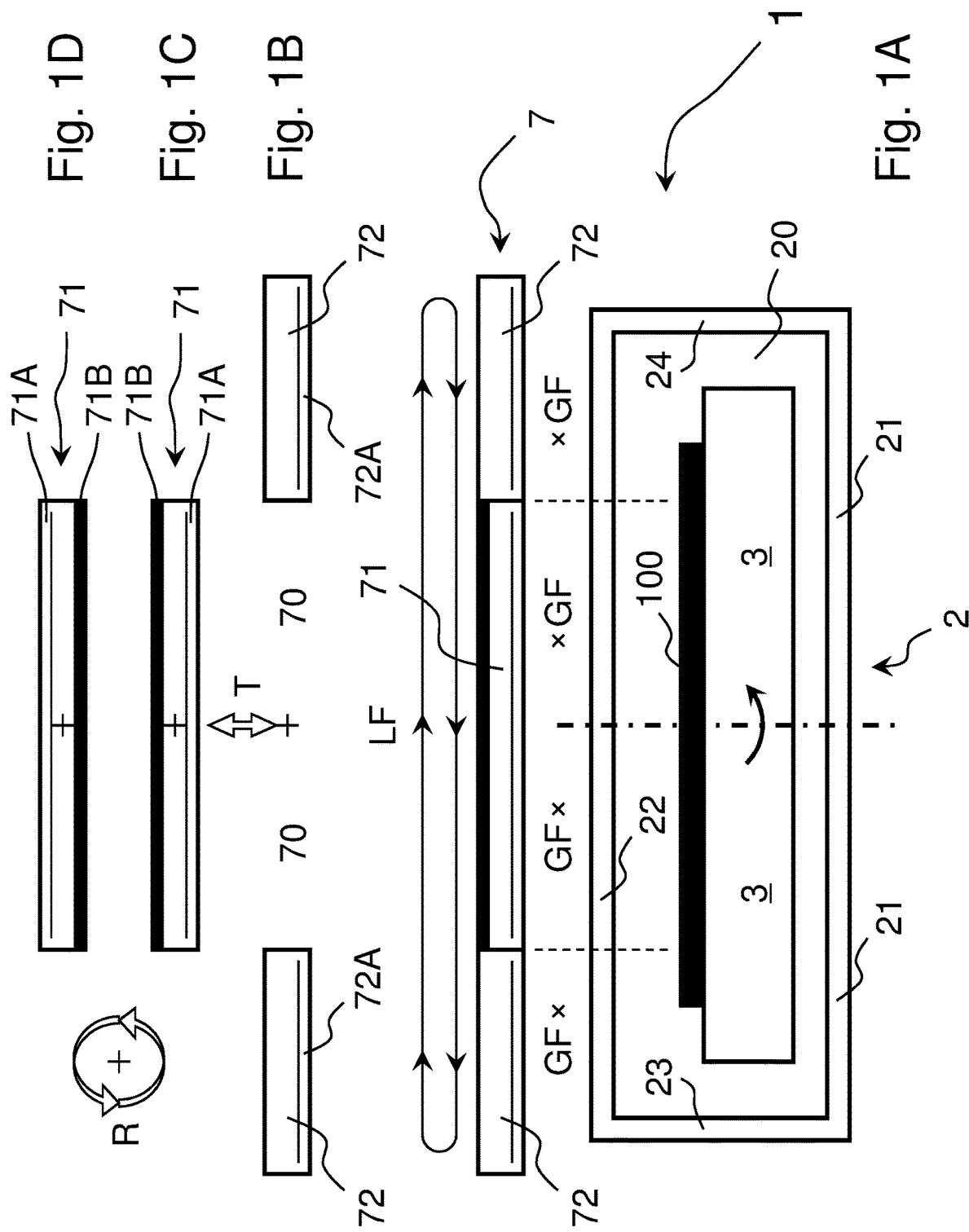

(51) Int. Cl.
*C30B 25/10* (2006.01)
*C23C 16/44* (2006.01)
*C23C 16/458* (2006.01)
*C23C 16/46* (2006.01)

(52) U.S. Cl.
CPC .............. *C23C 16/46* (2013.01); *C30B 25/08* (2013.01); *C30B 25/10* (2013.01)

(56) References Cited

U.S. PATENT DOCUMENTS

| | | | | |
|---|---|---|---|---|
| 2003/0200931 | A1* | 10/2003 | Goodwin | H01L 21/67115 118/725 |
| 2005/0098553 | A1* | 5/2005 | Devine | F27D 5/0037 219/411 |
| 2008/0135177 | A1* | 6/2008 | Kim | H01L 21/02057 156/345.43 |
| 2008/0202425 | A1* | 8/2008 | Gelatos | C23C 16/4411 118/724 |
| 2009/0190908 | A1* | 7/2009 | Shibagaki | H01L 21/68785 392/416 |
| 2010/0150534 | A1* | 6/2010 | Kasai | H01L 21/2686 392/416 |
| 2011/0230055 | A1* | 9/2011 | Ito | C23C 16/4585 438/758 |
| 2016/0033070 | A1 | 2/2016 | Brillhart et al. | |
| 2018/0019136 | A1* | 1/2018 | Hung | H01L 29/7848 |

FOREIGN PATENT DOCUMENTS

| | | |
|---|---|---|
| CN | 105316655 A | 2/2016 |
| JP | H07321059 A | 12/1995 |
| JP | 1997505798 A | 6/1997 |
| JP | 2007149774 A | 6/2007 |
| JP | 2013110145 A | 6/2013 |
| JP | 2016509751 A | 3/2016 |
| WO | WO2014176174 A1 | 10/2014 |

\* cited by examiner

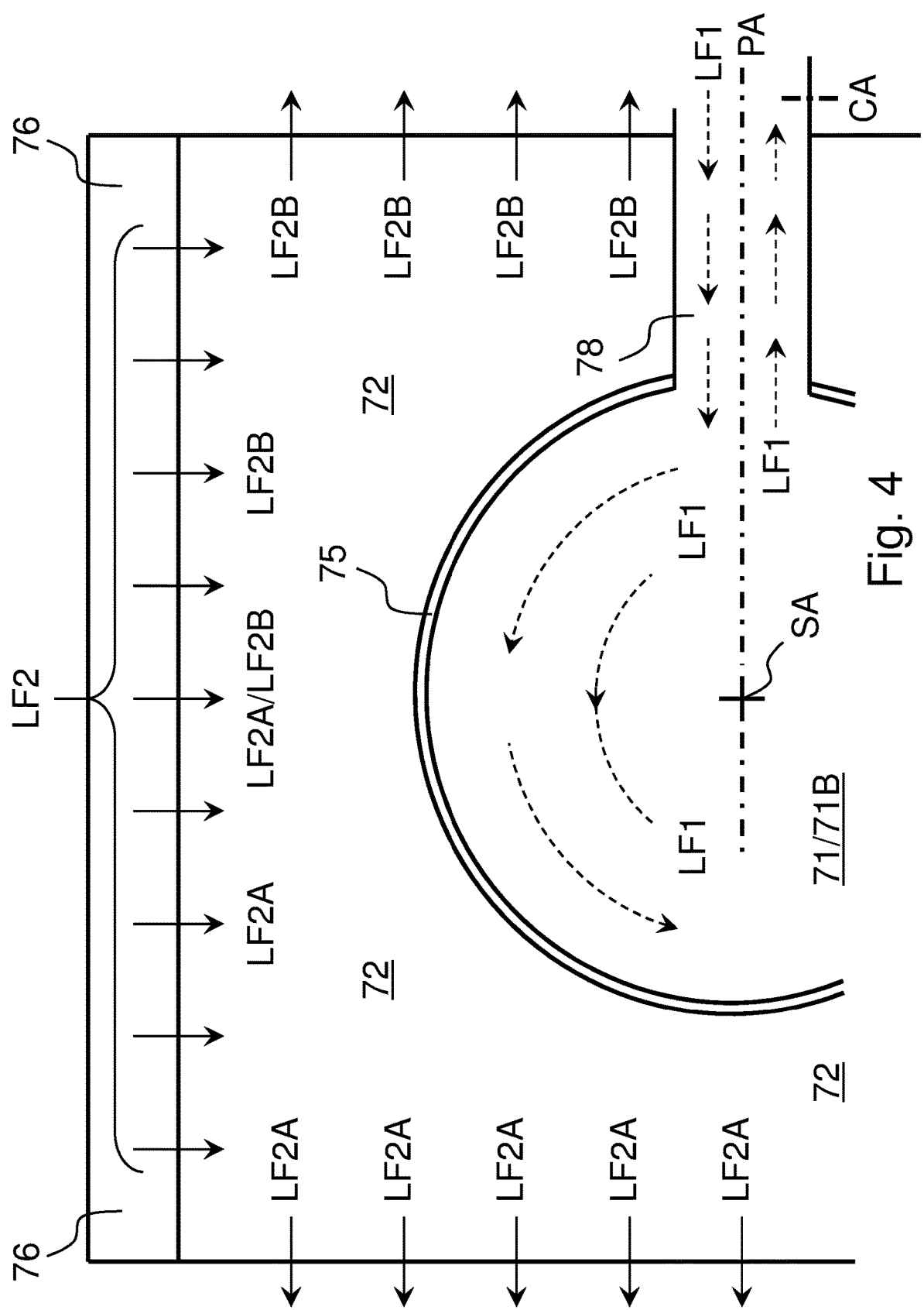

EPITAXIAL DEPOSITION REACTOR WITH REFLECTOR EXTERNAL TO THE REACTION CHAMBER AND COOLING METHOD OF A SUSCEPTOR AND SUBSTRATES

FIELD OF THE INVENTION

The present invention relates to an epitaxial deposition reactor with reflector external to the reaction chamber and a method of making uniform and quick the cooling of a susceptor and of substrates in a reaction chamber of an epitaxial deposition reactor.

STATE OF THE ART

Any epitaxial reactor comprises a heating system for heating the substrates to be subjected to epitaxial deposition which are located in a reaction chamber.

Frequently, the heating system directly heats a susceptor, and the substrates receive heat by conduction from the susceptor that support them.

Thus, an epitaxial deposition process phase is preceded by a heating phase.

For the purpose of epitaxial deposition, the substrates must be cooled from the high temperature of the process (for example a temperature in the range 800-1700° C.) to ambient temperature (for example a temperature in the range 16-32° C.). Part of the cooling of the substrates generally takes place inside the reaction chamber; if there is a susceptor in the reaction chamber, the susceptor is cooled as well. According to some known solutions, the substrates are extracted from the reaction chamber at a low temperature (for example a temperature in the range 100-250° C.); according to other known solutions, the substrates are extracted from the reaction chamber at an intermediate temperature (for example a temperature in the range 500-1000° C.).

According to some known solutions, the susceptor always remains in the reaction chamber; according to other known solutions, the susceptor is extracted together with the substrates.

Thus, an epitaxial deposition process phase is followed by a cooling phase.

The simplest way to obtain the cooling inside the reaction chamber is to deactivate the heating system and to wait some time; depending on the solutions and the processes, such time interval typically varies between 3 minutes and 30 minutes.

During this waiting period, the external walls of the reaction chamber can be cooled, for example by means of a flow of gas and/or a flow of liquid.

During this waiting period, the internal cavity of the reaction chamber can be cooled for example by means of a flow of gas.

It is advantageous for the cooling inside the reaction chamber to last a short time; the advantage can derive, for example, from the higher productivity of the reactor and/or from the better quality of the substrates treated in the reactor.

For the sake of completeness, it should be noted that, in the past (over twenty years ago), the present Applicant had provided a plurality of rotatable strips positioned above the entire upper wall of the reaction chamber: see patent document WO9610659A2.

According to this solution, all the strips have a first reflecting surface and a second absorbing surface, and can be positioned in any angular position so as to reflect thermal radiation emitted by said susceptor when desired. The positioning of the strips is obtained by means of two pluralities of gears lateral to the reaction chamber; all strips take the same angular position. This positioning is one of the operations of the initial set-up of the reactor.

According to this solution, above the strips, there is a tank of coolant liquid that is separated from the strips by a plate.

It should also be noted that the Applicant has never implemented the solution of patent document WO9610659A2 in its own products because it is too complicated (mechanically), too critical (many gears subjected to high temperatures and high thermal excursions) and too costly; instead, it has used reaction chambers made of transparent quartz with a thin layer of reflecting material (in general a paint containing gold) applied directly to the outer surface so as to reflect well thermal radiations emitted by the susceptor.

Patent document WO2014176174A1 describes and illustrates (see FIG. 1) a reactor in which a flat reflector (indicated with the numeral 122) is positioned above a curved upper wall (indicated with the numeral 128) of a reaction chamber. The reflector can have internally a channel in which water is made to flow in order to cool it; the inlet (indicated with the numeral 126) and the outlet (indicated with the numeral 126) of the channel are at the upper face of the reflector. The upper wall of the chamber can have internally a similar chamber in which water is made to flow to cool it.

SUMMARY

The Applicant has realised, as a result of experiments that it carried out, that it is very advantageous for the temperature of the substrate to be uniform not only during the process, but also during cooling; the advantage can derive, for example, from the reduction of heat stresses and defects, in particular "slip lines".

The Applicant has set itself the objective of providing a solution that allows obtaining a uniform temperature of the substrate both during epitaxial deposition and during cooling.

The Applicant also set itself the objective of providing a solution that allows quick cooling.

The Applicant lastly set itself the objective of providing a solution that is not only effective, but also simple.

These objectives are substantially achieved thanks to the epitaxial deposition reactor and to the cooling method having the technical features set out in the appended claims that are an integral part of the present description.

One aspect of the present invention corresponds to a method for making uniform and quick the cooling of a susceptor and of substrates in a reaction chamber of an epitaxial deposition reactor; its main technical features are set out in the appended claims that are an integral part of the present description.

LIST OF FIGURES

Figure 2:
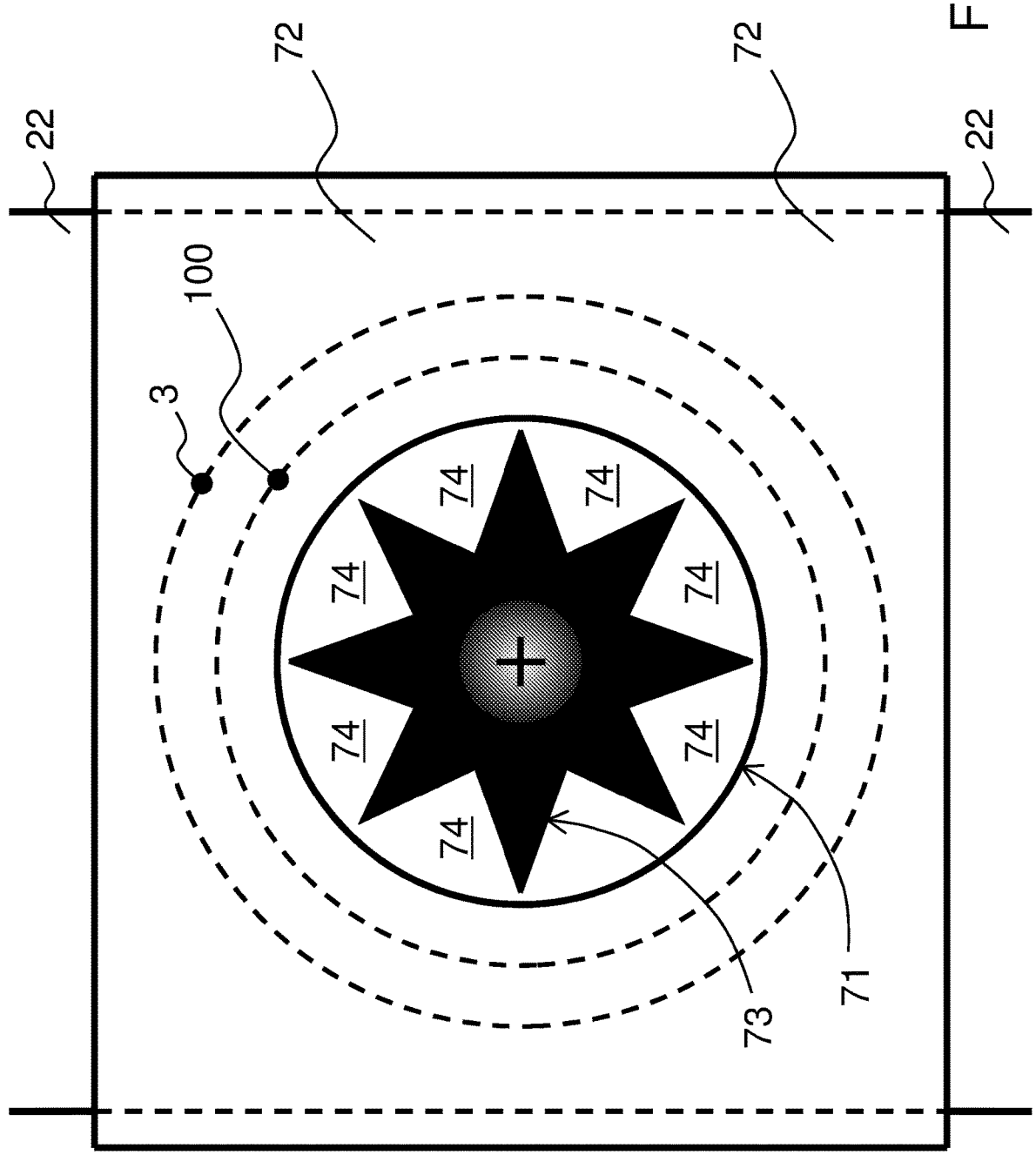
Figure 3:
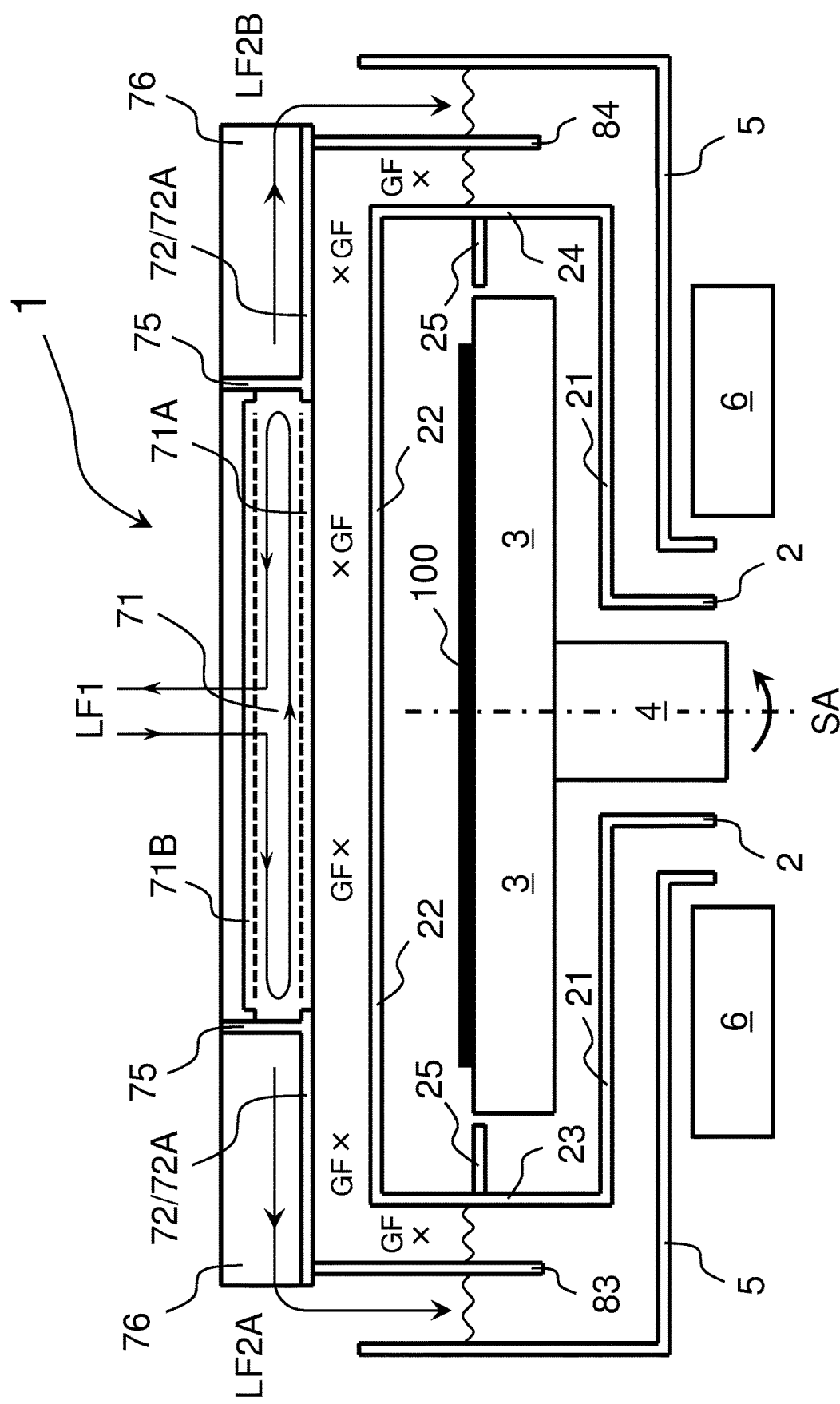

The present invention will be more readily apparent from the detailed description that follows, to be considered together with the accompanying drawings in which:

FIG. 1 shows a highly schematic (partial) vertical section view of an epitaxial deposition reactor in order to explain the present invention, FIG. 2 shows a highly schematic (partial) top view of the reactor of FIG. 1, FIG. 3 shows a schematic (partial) transverse vertical section view of an embodiment of an epitaxial deposition reactor according to the present invention, FIG. 4 shows a schematic (partial) top view from of the reactor of FIG. 3, FIG. 5 show, in a highly schematic manner, a plate of the reactor of FIG. 3 and FIG. 4 in three different positions.

As it is readily understandable, there are various ways of implementing in practice the present invention which is defined in its main advantageous aspects by the appended claims.

DETAILED DESCRIPTION

The present invention will now be described mainly with non-limiting reference to FIG. 1 and FIG. 2 that refer to a "single-wafer" reactor.

A reactor 1 for epitaxial deposition of semiconductor material on substrates (one of these is indicated with the numeral 100 in FIG. 1), comprises:
- a reaction chamber 2 provided with a cavity 20 defined to a great extent (with the exception of the front side, where the reaction gases enter, and of the rear side, where the exhaust gases exit) by a lower wall 21, an upper wall 22 and lateral walls 23 and 24,
- a susceptor 3 (of discoidal shape, i.e. a cylinder whose height is much smaller than the diameter, and rotating at least during epitaxial deposition processes), positioned inside the cavity 20, and adapted to support (directly as in FIG. 1A or indirectly, i.e. through a support element) and to heat substrates (100) at least during epitaxial deposition processes,
- a heating system 6 (see FIG. 3) adapted to heat the susceptor 3 (possibly also a substrate(s) support element, if provided),
- an upper plate 7, at least partially reflecting, which is positioned above the upper wall 22, at a certain distance, and which overlies at least most (for example 70% or 80% or 90%) of the susceptor 3 so that it reflects thermal radiation emitted by the susceptor 3 at least in part towards the susceptor 3;
- (at least) one controlled (i.e. non-natural) gaseous flow GF is provided between the upper wall 22 and the upper plate 7 to promote the transfer of heat from the upper wall 22 to the upper plate 7—in particular, the gaseous flow GF takes place in a conduit that is delimited superiorly by the lower surface of the plate 7 and inferiorly by the upper surface of the upper wall 22;
- (at least) one controlled (i.e. non-natural) liquid flow LF is provided in or on the upper plate 7 to cool the upper plate 7.

It is important to choose appropriately the temperature of the upper wall 22, in particular the temperature of its lower surface which faces the susceptor 3 and hence the supported substrates, during the epitaxial deposition; in fact, on the latter temperature depends possible spurious deposit on the wall during the epitaxial deposition.

The temperature of the upper plate 7 (which is a reflecting element), in particular the temperature of its upper surface, substantially corresponds to the temperature of the liquid; hence, there is excellent cooling.

The temperature of the upper wall 22 depends at least on four geometric parameters: distance between the susceptor 3 and the wall 22, thickness of the wall 22, distance between the wall 22, the plate 7 and thickness of the plate 7) and on two chemical parameters (the material of the wall 22 and the material of the plate 7). Since the upper plate 7 (which is a reflecting element) is external to the reaction chamber, these four geometric parameters can be selected quite freely in the design phase.

The gaseous flow GF is used to determine not only the temperature of the upper wall 22 (in particular that of its upper surface), but also the temperature profile in the gap between the wall 22 and the plate 7, as well as, at least in part, the temperature of the lower surface of the plate 7, and hence the transfer of heat from the wall 22 to the plate 7. The selection of the flow rate, of the velocity, of the temperature and of the chemical content of the gaseous flow GF allows to determine these temperatures in a broad range; this is advantageous because the aforesaid geometric parameters are set in the design phase and do not lend themselves to be modified during operation, i.e. they do not constitute a degree of freedom in controlling these temperatures.

As shown in FIG. 1, advantageously, the lower surface of the plate 7 and the upper surface of the upper wall 22 are parallel; still more advantageously, they are both flat. In this way, a tangential and uniform gaseous flow GF can be established between the wall 22 and the plate 7 (in a parallel direction to their surfaces and perpendicular to the axis of rotation of the susceptor 3) and velocity and flow rate of the flow can be chosen freely and the effect of the flow on temperatures can be forecast with good precision.

Typically, the upper wall is made of transparent quartz and the upper plate is made of a metal (or a metal alloy) such as copper, aluminium, steel.

The gaseous flow GF (in particular its flow rate and/or velocity and/or temperature) can differ according to the operating phase of the reactor (heating, deposition, cooling); moreover, it may vary within the same operating phase.

The liquid flow LF can differ according to the operating phase of the reactor (heating, deposition, cooling); moreover, it may vary within the same operating phase.

The plate 7 comprises a first part 71 that overlies at least most (for example 70% or 80% or 90%) of the susceptor 3 and that is adapted to move to reflect differently, for example it could simply rotate by 90°. Specifically, the first part 71 can translate (arrows T in FIG. 1) and rotate (arrows R in FIG. 1), in particular around its axis of symmetry; more specifically (see FIG. 1B, FIG. 1C and FIG. 1D), the first part 71 from the position of FIG. 1A, first raises relative to the second part 72 (see FIG. 1B and FIG. 1C together), then rotates by 180° (FIG. 1C corresponds to before the rotation and FIG. 1D corresponds to after the rotation) (see also FIG. 1B and FIG. 1D together) and lastly lowers relative to the second part 72 (there is no corresponding figure).

In FIG. 1, the plate 7 is divided in a first part 71 and a second part 72. The second part 72 is positioned around the first part 71 (in particular, the first part 71 is inserted in a hole 70 of the second part 72) and overlies at most to a minimal extent (for example 30% or 20% or 10%) the susceptor 3; the second part 72 is adapted to be maintained fixed at all times in order to reflect equally; specifically, a lower face 72A of the second part 72, i.e. the one closer to the upper wall 22, is adapted to reflect thermal radiation at least in part towards the susceptor 3. Naturally, the second part 72 also can move during assembling, disassembling and maintaining operations of the reactor; in particular, in these operations, the first part 71 and the second part 72 can move integrally according to a different motion from the motion of the first part 71 alone.

FIGS. 1A-1D serve the purpose of explaining in a simplified manner the positioning and the movement of the first part 71 relative to the second part 72; the translations and the rotations of the first part 71 can derive from more complicated movements, as shall be understood from the embodiment of FIG. 3 and FIG. 4.

In FIG. 1, a first face 71A of the first part 71 is adapted to reflect thermal radiation and a second face 71B of the first part 71 is adapted to absorb thermal radiation.

In FIG. 2, the second face 71B has at least one absorbing shaped area 73, in particular in the shape of a star, and at least one reflecting shaped area 74; the areas 73 and 74 are, in particular, complementary. The shape of the absorbing area 73 is such that the average absorption (calculated along a circumference) decreases from the centre of the first part 71 to the periphery of the first part 71; in other words, the plate 7 absorbs much at the centre and little or nothing in the periphery; since the susceptor 3 is rotating, what matters is mainly the average absorption and not the absorption at each point.

In FIG. 1 and FIG. 2, the susceptor 3 has circular (or substantially circular) shape and also the first part 71 has circular (or substantially circular) shape; moreover, the diameter of the first part 71 is smaller (e.g. by 20% or 15% or 10%, or by 40 mm or 30 mm or 20 mm) of the diameter of the susceptor 3.

In FIG. 1 and FIG. 2, the susceptor 3 is adapted to support a single substrate 100 with circular (or substantially circular) shape; the diameter of the first part 71 is smaller (e.g. by 15% or 10% or 5%, or by 30 mm or 20 mm or 10 mm) of the diameter of the individual substrate 100.

In FIG. 1 and FIG. 2, the second part 72 has a hole 70 with a shape that is for example substantially circular, and the shape of the hole 70 (substantially) matches the shape of the first part 71.

FIG. 1 and FIG. 2 show only one gaseous flow GF and only one liquid flow LF; however, there can be more than two flows. For example, as will be understood considering FIG. 3 and FIG. 4, there can be a first liquid flow LF1, in particular controlled (i.e. non-natural) in or on a first part 71 of the plate 7, and, separately, a second liquid flow LF2, in particular controlled (i.e. non-natural), in or on a second part 72 of the plate 7; moreover, a single flow can be subdivided and branched, as is the case of the flow LF2 in FIG. 3 and FIG. 4 which is subdivided and is branched to the left (LF2A) and to the right (LF2B).

Considering FIG. 1 and FIG. 2 (FIG. 5 can also be useful for understanding), a method of making uniform and quick the cooling of the susceptor 3 in the reaction chamber 2 of the reactor 1 for epitaxial deposition and of substrates (100) supported (directly or indirectly) by the susceptor 3, comprises the steps of:

A) arranging the plate 7 on the upper wall 22,

B) placing the first part 71 of the plate 7 in a first position (FIGS. 1A and 1C) so that it reflects thermal radiation emitted by the susceptor 3 towards the susceptor 3, and maintaining this first position (FIG. 1A) during an epitaxial deposition process, and subsequently C) placing the first part 7 in a second position (FIG. 1D) in such a way that it does reflect (in particular absorb) thermal radiation emitted by the susceptor 3 towards the susceptor 3, and maintaining this second position (immediately) after the end of the epitaxial deposition process.

It should be noted that the liquid flow LF and the gaseous flow GF are very advantageous, but not indispensable for the purposes of the method described above.

In FIG. 1 and FIG. 2, the first part 71 of the plate 7 is rotated (R) by 180° (in particular around its axis of symmetry), in order to carry out the steps B and C.

In FIG. 1 and FIG. 2, the first part 71 of the plate 7 has only two operating positions, both horizontal.

In FIG. 1 and FIG. 2, the plate 7 divided in a first part 71 and a second part (72) (reflecting), the first part 71 is appropriately rotated while the second part 72 is always maintained fixed.

In particular, considering that the first face 71A is adapted to reflect thermal radiation and the second face 71B is adapted to absorb thermal radiation:

step B is carried out by placing the first part 71 with the first face 71A facing the susceptor 3, step C is carried out by placing the first part 71 with the second face 71A facing the susceptor 3.

Typically, the susceptor 3 with one or more substrates (100) rotates both when the first face 71A faces the susceptor 3 and when the second face 71B faces the susceptor 3.

Advantageously, the absorbing and reflecting face 71B can be configured as shown in FIG. 2 or in an equivalent manner.

Advantageously, at least one controlled (i.e. non-natural) gaseous flow (GF in FIG. 1) can be established between the plate 7 and the upper wall 22 of the reaction chamber 2 to promote the transfer of heat from the upper wall to the plate.

Advantageously, at least one controlled (i.e. non-natural) liquid flow (LF in FIG. 1) can be established in or on the plate 7 to cool the plate 7.

Since it has been observed that the peripheral annular areas tend to cool more quickly than the central area (this is also due to the fact that the shape of the susceptor is that of a cylinder whose height is far smaller than the diameter), thought was given to achieving greater absorption of thermal radiation at the central area and lower absorption of thermal radiation at the peripheral annular areas. For this purpose, for example, the plate 7 in FIG. 1 and FIG. 2 is configured so that a peripheral annular area of the susceptor 3 is always substantially subjected to the same reflection of thermal radiation; in fact, the second part 72 is fixed and reflecting and the hole 70 has smaller diameter than the diameter of the susceptor 3. For the same reason, in certain cases, it can be convenient to choose the diameter of the hole 70 in such a way that it is smaller than the diameter of the substrate (100 in FIG. 1 and FIG. 2).

The embodiment of FIG. 3 and FIG. 4 will be described below.

As is readily apparent from the figures, the embodiment of FIG. 3 and FIG. 4 reflects, in general, what is described in relation to FIG. 1 and FIG. 2.

The susceptor 3 (in the shape of a cylinder with far smaller height than diameter) is fastened to a rotating shaft 4.

The lower wall 21 of the chamber 2 has a hole and a sleeve for the passage of the shaft 4.

Inside the cavity 20 of the chamber 2 there are horizontal inner walls 25 aligned to the substrate 100.

All the walls of the chamber 2 are made of transparent quartz.

The chamber 2 is partially immersed in a liquid contained in a tank 5; the liquid is typically water.

The plate 7 serves as an outer counter-wall of the upper wall 22 of the chamber 2. In addition, there is a first lateral plate 83 that serves as an outer counter-wall of the first lateral wall 23 of the chamber 2 and a second lateral plate 84 that serves as an outer counter-wall of the second lateral wall 24 of the chamber 2. Both the first lateral plate 83 and the second lateral plate 84 are reflecting.

The first part of the plate 7 consists of a hollow element 71 having a lower plate 71A and an upper plate 71B and within which flows the liquid flow LF1 in particular around an axis SA (there are means, not shown in the figure, that guide the flow) that corresponds to the axis of the susceptor; the second part of the plate 7 consists of a simple plate 72 whereon flows the liquid flow LF2 (LF2A+LF2B) that falls laterally in the tank 5. At the hole 70, there is a barrier 75 that surrounds the element 71.

The liquid flow LF2 comes from two lateral distributor conduits 76 (only one of which is shown in FIG. 4) which spray liquid on the plate 72; a first part LF2A of this liquid then flows from a first side and a second part LF2B of this liquid then flows from a second side also by effect of the barrier 75.

In FIG. 4, an arm 78 that is mechanically fastened to the element 71 is also schematically shown. The arm 78 is hollow and the liquid flow LF1 enters into and exits from the element 71 through the arm 79. The arm 78 is also used to raise, rotate (by 180° around its axis PA) and to lower the element 71; in particular, the arm 78 rotates around an axis parallel to a first lateral edge of the chamber 2 and hence the raising and the lowering of the element 71 is not a simple translation; advantageously, to carry out assembly, disassembly and maintenance operations on the reactor, the first part 71 (together with the arm 78) and the second part 72 (together with the conduits 76) move integrally and rotate around an axis CA parallel to a second lateral edge of the chamber 2 opposite the first.

The heating system of the reactor, for example the system 6 in FIG. 3, typically consists of at least one inductor, comprising a plurality of windings, adapted to heat the susceptor 3 (and possibly one or more support elements) by electromagnetic induction when the windings are electrically powered.

In order to obtain a uniform heating of the susceptor 3, it is also possible, during the cooling, to (slightly) electrically power some windings and modify the position of one or more powered windings; for example, an open-loop control could be used based on temperature (and on experimental campaigns), or a closed loop control could be used as a function of temperature.

Figure 5A:
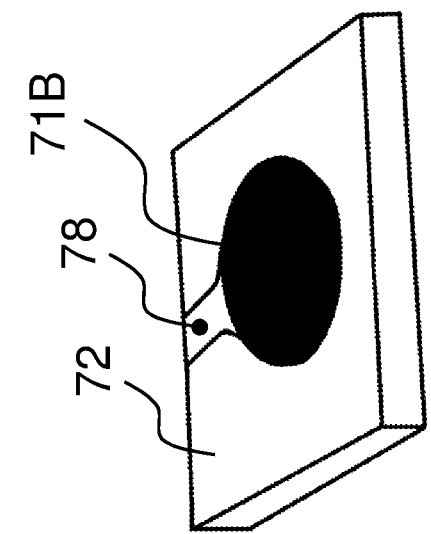
Figure 5B:
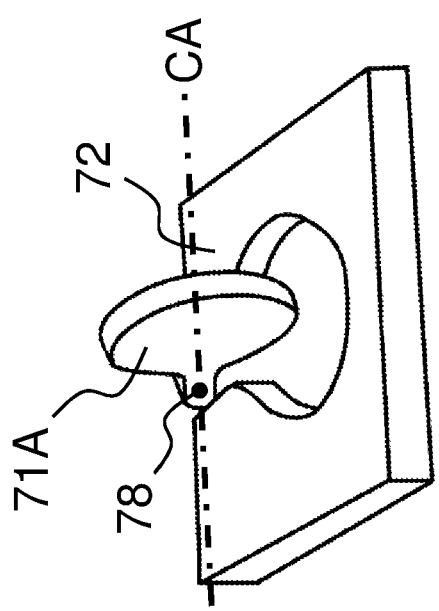
Figure 5C:
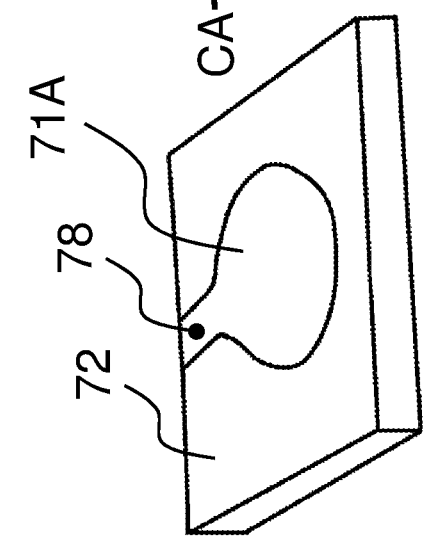

FIG. 5 helps understanding the movements of the plate 7, more specifically the movement of the element 71 and of the arm 78 (the element 72 is fixed). In FIG. 5A, the elements 71 and 72 are aligned, the element 71 is positioned so that the reflecting face 71A is oriented upwards and the absorbing face 71B is oriented downwards. In FIG. 5B, the element 71 is in a position (subsequent to the one of FIG. 5A) consequent to the rotation of the assembly 71+78 upwards for example by 35° around the axis CA and then to the rotation of the assembly 71+78 by 180° around the axis PA. In FIG. 5C, the element 71 is in a position (subsequent to the one of FIG. 5B) consequent to the rotation of the assembly 71+78 by 180° around the axis PA and then to the rotation of the assembly 71+78 downwards by 35° around the axis CA. In FIG. 5C, the elements 71 and 72 are aligned, the element 71 is positioned so that the reflecting face 71A is oriented downwards and the absorbing face 71B (dark coloured) is oriented upwards.

The invention claimed is:

1. A reactor for epitaxial deposition of semiconductor material on substrates, comprising:
    a reaction chamber provided with a cavity defined by a lower wall, an upper wall and lateral walls,
    a susceptor, positioned inside said cavity, and adapted to support and heat substrates during epitaxial deposition,
    a heater adapted to heat said susceptor,
    an upper plate that is positioned above said upper wall and that overlies said susceptor so that it reflects thermal radiation emitted by said susceptor towards said susceptor;
    wherein a liquid flow is provided in or on said upper plate to cool said upper plate;
    wherein a gaseous flow is provided between said upper wall and said upper plate to promote the transfer of heat from said upper wall to said upper plate;
    wherein a first part of said upper plate overlies said susceptor, wherein said first part of said upper plate is adapted to rotate relative to a fixed second part of said upper plate in order to reflect differently.

2. A reactor according to claim 1, wherein said second part of said upper plate is positioned around said first part of said upper plate.

3. A reactor according to claim 2, wherein at least one face of said second part of said upper plate is adapted to reflect thermal radiation towards said susceptor.

4. A reactor according to claim 1, wherein a first face of said first part of said upper plate is adapted to reflect thermal radiation and a second face of said first part of said upper plate is adapted to absorb thermal radiation.

5. A reactor according to claim 4, wherein said second face of said first part of said upper plate has at least one absorbing area and at least one reflecting area; said areas being complementary.

6. A reactor according to claim 1, wherein a first liquid flow is provided in or on a first part of said upper plate, and wherein a second liquid flow is provided in or on a second part of said upper plate.

7. A reactor according to claim 1, wherein said susceptor has circular shape, wherein said first part of said upper plate has a circular shape, and wherein the diameter of said first part of said upper plate is smaller than the diameter of said susceptor.

8. A reactor according to claim 7, wherein said susceptor is adapted to support a single substrate with a circular shape, and wherein the diameter of said first part of said upper plate is smaller than the diameter of said single substrate.

9. A reactor according to claim 2, wherein said second part of said upper plate has a hole with a shape, and wherein the shape of said hole of said second part of said upper plate corresponds to the shape of said first part of said upper plate.

10. An apparatus, comprising:
    a reactor for epitaxial deposition of semiconductor material on substrates including:
        a reaction chamber provided with a cavity defined by a lower wall, an upper wall and lateral walls,
        a susceptor positioned inside said cavity and adapted to support and heat substrates during epitaxial deposition,
        a heater adapted to heat said susceptor,
        an upper plate positioned above said upper wall and overlying said susceptor so that it reflects thermal radiation emitted by said susceptor towards said susceptor;
    wherein a liquid flow is provided in or on said upper plate to cool said upper plate;
    wherein a gaseous flow is provided between said upper wall and said upper plate to promote the transfer of heat from said upper wall to said upper plate;
    wherein said upper plate comprises a first plate and a second plate, the second plate being configured to remain fixed, the first plate being configured to rotate and translate relative to the second plate and take at least a first position and a second position both overlying the susceptor,
wherein reflection of said first plate towards said susceptor in said first position is different from reflection of said first plate towards said susceptor in said second position.

11. An apparatus, comprising:
a reactor for epitaxial deposition of semiconductor material on substrates including:
a reaction chamber provided with a cavity defined by a lower wall, an upper wall and lateral walls,
a susceptor positioned inside said cavity and adapted to support and heat substrates during epitaxial deposition,
a heater adapted to heat said susceptor,
an upper plate positioned above said upper wall and overlying said susceptor, said a first part of the upper plate rotating relative to a fixed second part to differently reflect thermal radiation emitted by said susceptor towards said susceptor;
wherein a liquid flow is provided to cool said upper plate;
wherein a gaseous flow is provided between said upper wall and said upper plate to promote the transfer of heat from said upper wall to said upper plate.

\* \* \* \* \*